(12) United States Patent
Murase (10) Patent No.: US 11,410,943 B2
(45) Date of Patent: Aug. 9, 2022

(54) ACTIVE ELEMENT, HIGH-FREQUENCY MODULE, AND COMMUNICATION DEVICE

(71) Applicant: Murata Manufacturing Co., Ltd., Nagaokakyo (JP)

(72) Inventor: Hisanori Murase, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/413,642

(22) Filed: May 16, 2019

(65) Prior Publication Data

US 2019/0267339 A1  Aug. 29, 2019

Related U.S. Application Data

(63) Continuation of application No. PCT/JP2017/044417, filed on Dec. 11, 2017.

(30) Foreign Application Priority Data

Dec. 15, 2016 (JP) .............................. JP2016-243801

(51) Int. Cl.
*H01L 23/66* (2006.01)
*H04B 1/40* (2015.01)
(Continued)

(52) U.S. Cl.
CPC .............. *H01L 23/66* (2013.01); *H01L 23/12* (2013.01); *H01L 24/17* (2013.01); *H04B 1/40* (2013.01);
(Continued)

(58) Field of Classification Search
CPC ........... H01L 24/17; H01L 2224/17181; H01L 2223/6611; H01L 2223/6616;
(Continued)

(56) References Cited

U.S. PATENT DOCUMENTS 10,446,531 B2 * 10/2019 Betsui .................... H01L 24/17
2002/0049042 A1   4/2002 Oida et al.
(Continued)

FOREIGN PATENT DOCUMENTS

JP     11-219647 A      8/1999
JP     11219647 A   *  8/1999  ............. H05K 1/145
(Continued)

OTHER PUBLICATIONS

Official Communication issued in International Patent Application No. PCT/JP2017/044417, dated Feb. 13, 2018.

*Primary Examiner* — Lana N Le
(74) *Attorney, Agent, or Firm* — Keating & Bennett, LLP (57) ABSTRACT

A high-frequency module includes a circuit board including wiring patterns, a resin on an active element mounted on the circuit board and a side of the circuit board and sealing the active element, and connection conductors penetrating the resin from a surface of the resin and provided on a top surface of the active element. The active element includes a first connection electrode on a surface facing the circuit board, and a second connection electrode on a top surface opposite to the surface facing the circuit board. The first connection electrode is connected to a wiring pattern on the circuit board, and the second connection electrode is connected to the connection conductor and an outer electrode and is not connected to the wiring pattern.

19 Claims, 9 Drawing Sheets

(51) Int. Cl.
*H04B 1/48* (2006.01)
*H05K 1/18* (2006.01)
*H01L 23/00* (2006.01)
*H05K 1/02* (2006.01)
*H05K 1/11* (2006.01)
*H01L 23/12* (2006.01)

(52) U.S. Cl.
CPC ............ *H04B 1/48* (2013.01); *H05K 1/0216* (2013.01); *H05K 1/116* (2013.01); *H05K 1/181* (2013.01); *H01L 2223/6611* (2013.01); *H01L 2223/6616* (2013.01); *H01L 2224/17181* (2013.01); *H01L 2924/00014* (2013.01); *H05K 2201/0715* (2013.01); *H05K 2201/09227* (2013.01); *H05K 2201/1003* (2013.01); *H05K 2201/1006* (2013.01); *H05K 2201/10015* (2013.01); *H05K 2201/10053* (2013.01); *H05K 2201/10545* (2013.01)

(58) Field of Classification Search
CPC ........... H01L 2924/00014; H01L 24/16; H01L 23/66; H01L 23/12; H01L 2223/6677; H01L 2224/04105; H01L 2224/14134; H01L 2224/73259; H01L 2924/14; H01L 2924/15192; H01L 2924/181; H01L 2924/3025; H01L 23/49822; H01L 23/5389; H01L 23/552; H01L 2223/6605; H01L 24/14; H01L 25/16; H01L 2224/14181; H01L 2224/16225; H01L 2224/16245; H01L 2924/1532; H01L 2924/19105; H01L 2924/19106; H04B 1/40; H04B 1/48; H05K 1/0216; H05K 1/116; H05K 1/181; H05K 2201/0715; H05K 2201/09227; H05K 2201/10015; H05K 2201/1003; H05K 2201/10053; H05K 2201/1006; H05K 2201/10545

See application file for complete search history.

(56) References Cited

U.S. PATENT DOCUMENTS

| | | | |
|---|---|---|---|
| 2005/0104792 A1* | 5/2005 | Asao | H01Q 13/10 343/767 |
| 2008/0172871 A1* | 7/2008 | Shirai | H05K 3/44 216/13 |
| 2012/0195009 A1* | 8/2012 | Brueckel | H01F 27/06 361/752 |
| 2014/0002209 A1 | 1/2014 | Ono | |
| 2014/0011453 A1* | 1/2014 | Kuroda | H01L 23/3128 455/41.2 |
| 2017/0223875 A1* | 8/2017 | Tsu | H02M 7/003 |
| 2018/0204827 A1* | 7/2018 | Betsui | G11C 5/025 |
| 2019/0102596 A1* | 4/2019 | Suzuki | G06K 9/0004 |
| 2021/0193628 A1* | 6/2021 | Hori | H01L 23/5385 |
| 2021/0226652 A1* | 7/2021 | Matsumoto | H04B 1/38 |

FOREIGN PATENT DOCUMENTS

| | | | | |
|---|---|---|---|---|
| JP | 2002-009225 A | | 1/2002 | |
| JP | 2002-252292 A | | 9/2002 | |
| JP | 2002252292 A | * | 9/2002 | ........... H01L 23/552 |
| WO | 2012/128271 A1 | | 9/2012 | |

* cited by examiner

ACTIVE ELEMENT, HIGH-FREQUENCY MODULE, AND COMMUNICATION DEVICE

CROSS REFERENCE TO RELATED APPLICATIONS

This application claims the benefit of priority to Japanese Patent Application No. 2016-243801 filed on Dec. 15, 2016 and is a Continuation Application of PCT Application No. PCT/JP2017/044417 filed on Dec. 11, 2017. The entire contents of each of these applications are hereby incorporated herein by reference.

BACKGROUND OF THE INVENTION

1. Field of the Invention

The present invention relates to an active element, a high-frequency module, and a communication device.

2. Description of the Related Art

In recent years, as a method for controlling a switch provided in a high-frequency module, such as a high-frequency front end circuit, switch control using digital signals is becoming mainstream. In the switch control using digital signals, a digital control signal, which is a pulsed serial clock signal, is supplied to a control circuit of a switch and an amplifier circuit to drive the switch and the amplifier circuit. In such a high-frequency module, a switch (switch IC (Integrated Circuit)) defined by a semiconductor chip is mounted on a circuit board. Accordingly, it is possible to control, with high accuracy, transmission and reception of high-frequency signals in the high-frequency module (see, for example, Japanese Unexamined Patent Application Publication No. 2002-252292).

Japanese Unexamined Patent Application Publication No. 2002-252292 discloses an electronic component mounting substrate in which electronic components, such as a semiconductor chip, are disposed on a circuit board. In the electronic component mounting substrate, a semiconductor chip is connected to one surface of the circuit board by a bump (connection electrode), and the semiconductor chip is sealed on the circuit board by a resin. Additionally, a post (connection conductor) defining an input/output terminal is formed by penetrating the resin from the circuit board to a resin surface. The semiconductor chip and the input/output terminal are connected to each other with a wiring pattern formed on the circuit board interposed therebetween.

As in the related art, in a case of a high-frequency module in which a semiconductor chip is mounted on a circuit board, there is a tendency for noise to leak from a wire (RF line) through which a high-frequency signal is transmitted to a wire (control line) through which a control signal is transmitted. Further, there is a problem that the control signal from the control line interferes with the high-frequency signal transmitted through the RF line, and as a result, communication quality, such as a signal-to-noise (S/N) ratio, of the high-frequency signal and reception sensitivity is reduced.

In order to prevent such a reduction in communication quality, it is necessary to ensure sufficient isolation between the RF line and the control line. However, in the structure of the related art, since the control line and the RF line are disposed within the same plane of the substrate, a problem arises that unnecessary coupling between wires is likely to occur, and accordingly sufficient isolation cannot be ensured.

SUMMARY OF THE INVENTION

Preferred embodiments of the present invention provide active elements, high-frequency modules, and communication devices that are each capable of ensuring isolation between an RF line and a control line.

An active element according to a preferred embodiment of the present invention includes an RF wire which is disposed on one surface and through which a high-frequency signal is communicated, and a control wire which is disposed on another surface opposite to the one surface and through which a control signal is communicated.

Accordingly, in the active element, the RF wire and the control wire do not extend to the same surface, and extend to different surfaces opposite to each other. As a result, it is possible to reduce or prevent unnecessary coupling between the wires in the active element. Thus, isolation between the RF line and the control line is able to be ensured in the active element.

A high-frequency module according to a preferred embodiment of the present invention includes a circuit board including a wiring pattern, an active element according to a preferred embodiment of the present invention mounted on the circuit board, including a first connection electrode on one surface facing the circuit board and a second connection electrode on another surface opposite to the one surface facing the circuit board, a resin sealing the active element and a side of the circuit board on a surface of which the active element is mounted, an outer electrode provided on a surface of the resin opposite to a surface at which the circuit board is disposed, and including a first outer connection terminal and a second outer connection terminal, a first connection conductor penetrating the resin from the surface of the resin opposite to the surface at which the circuit board is disposed, and connecting the second connection electrode provided on a top surface of the active element and the first outer connection terminal, and a second connection conductor connecting the wiring pattern and the second outer connection terminal, wherein a high-frequency signal is communicated through the first connection electrode, a control signal is communicated through the second connection electrode, the first connection electrode is connected to the wiring pattern provided on the circuit board, and the second connection electrode is connected to the first connection conductor without the wiring pattern interposed therebetween.

Thus, the RF line defined by the first connection electrode and the wiring pattern provided on the circuit board, and the control line defined by the second connection electrode and the first connection conductor extend to different surfaces, of the active element, opposite to each other, and are not connected in the same circuit board, and therefore, the isolation between the RF line and the control line is able to be ensured.

Further, the circuit board may include electronic components on both surfaces thereof.

As a result, the electronic components are mounted on both sides of the circuit board, and therefore the number of the electronic components mounted on the circuit board is able to be increased. Further, even when the electronic components are mounted on both sides of the circuit board, the isolation between the RF line and the control line is able to be ensured.

Further, a shield disposed above a surface of the circuit board opposite to the surface on which the active element is mounted may be provided.

As a result, it is possible to reduce or prevent noise entering the high-frequency module from outside.

Further, the shield may be provided on a side surface of the circuit board and on a side surface of the resin.

Accordingly, since the shield surrounds a periphery of the high-frequency module, it is possible to further reduce or prevent noise entering the high-frequency module from the outside.

Further, a connection conductor penetrating the resin from the circuit board and being connected to the shield may be included.

Thus, even when the shield is not provided on the side surface of the circuit board and the side surface of the resin, noise entering the high-frequency module from the side surface of the circuit board and the side surface of the resin is able to be reduced or prevented by the connection conductor.

Also, the second outer connection terminal penetrating the resin from a surface of the resin and connected to the first connection electrode with the wiring pattern interposed therebetween, and a third connection conductor connected to a ground potential between the first connection conductor and the second connection conductor in plan view may be included.

Thus, since the third connection conductor connected to the ground potential is disposed between the first connection conductor of the RF line and the second connection conductor of the control line, the isolation between the RF line and the control line is able to be further ensured.

A communication device according to a preferred embodiment of the present invention includes a high-frequency module according to a preferred embodiment of the present invention.

Thus, the isolation between the RF line and the control line is able to be ensured in the communication device.

The active elements, the high-frequency modules, and the communication devices according to preferred embodiments of the present invention are able to ensure isolation between an RF line and a control line.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the accompanying drawings. Note that, the preferred embodiments described below are inclusive or specific examples. Numerical values, shapes, materials, elements, arrangement and connection configurations of the elements described in the following preferred embodiments are merely examples, and are not intended to limit the scope of the present invention. Among the elements in the following preferred embodiments, elements that are not described in independent claims will be described as optional elements. Also, sizes or ratios between sizes of the elements illustrated in the drawings are not necessarily accurate.

Preferred Embodiment 1

A high-frequency module (RF module) 1 according to a Preferred Embodiment 1 of the present invention is included in a communication device 5 used to transmit and receive a high-frequency signal, for example.

Figure 1:
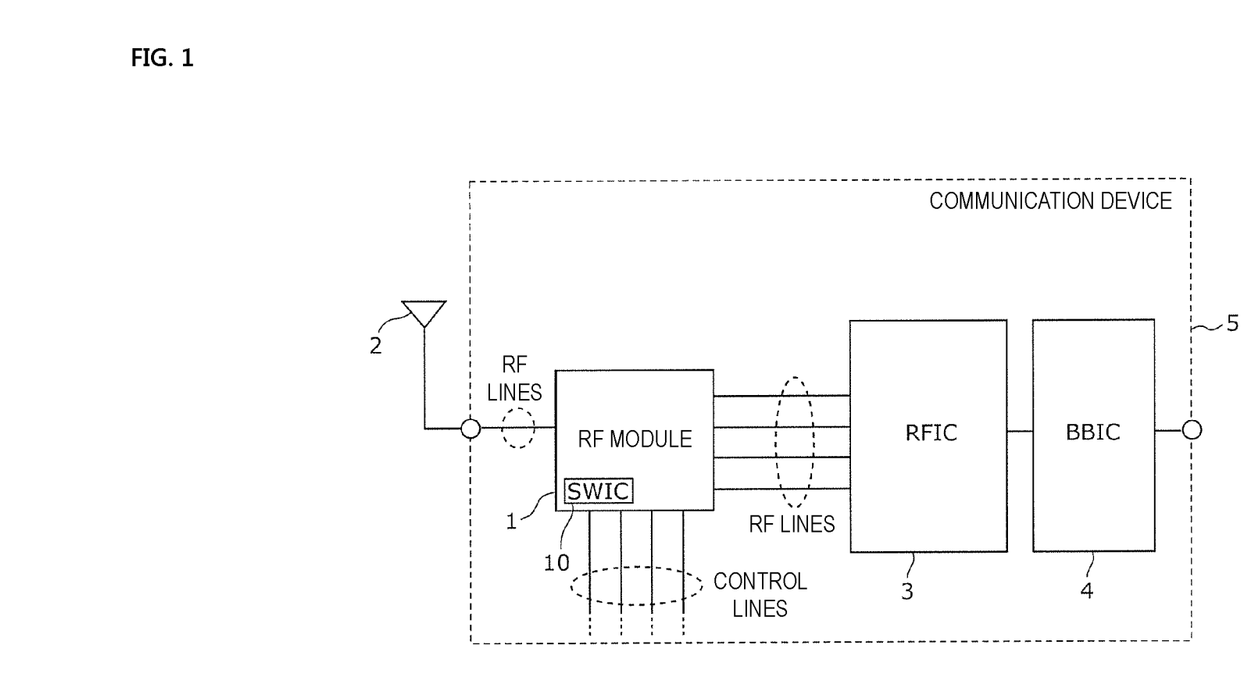
FIG. 1 is a functional block diagram of a communication device according to a Preferred Embodiment 1 of the present invention.
Figure 2:
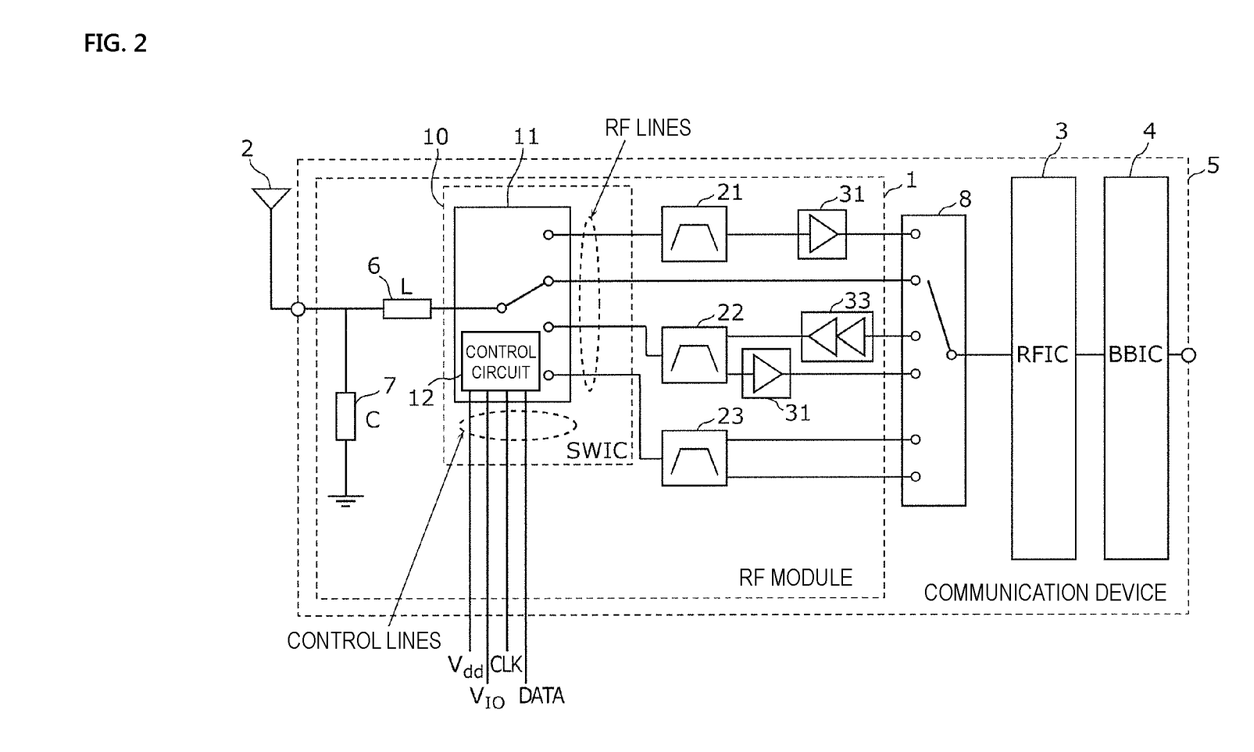
FIG. 2 is a schematic plan view illustrating a circuit arrangement of the communication device according to the Preferred Embodiment 1 of the present invention.

First, a configuration of the communication device 5 according to the present preferred embodiment will be described. FIG. 1 is a functional block diagram of the communication device 5 according to the present preferred embodiment. FIG. 2 is a schematic plan view illustrating a circuit configuration of the communication device 5 according to the present preferred embodiment.

As illustrated in FIG. 1 and FIG. 2, the communication device 5 includes the RF module 1, an RF signal processing circuit (RFIC) 3, and a baseband signal processing circuit (BBIC) 4. The communication device 5 is connected to an antenna element 2. Note that, as illustrated in FIG. 2, the communication device 5 may include a switch 8 between the RF module 1 and the RFIC 3.

In the communication device 5, an RF line which is a wire through which a high-frequency communication signal is transmitted, and a control line which is a wire through which a control signal to control the RF module 1 is transmitted are provided.

The RF line is provided between a terminal to which the antenna element 2 is connected and the RF module 1, between the RF module 1 and the RFIC 3, and between the RFIC 3 and the BBIC 4. Further, the control line is provided between a switch 11 and a control circuit 12 in a switch IC (SWIC) 10 disposed in the RF module 1, for example, as will be described later.

The RF module 1 is disposed, for example, in a front end unit of a multi-mode/multiband supporting cellular phone. As illustrated in FIG. 2, the RF module 1 is a high-frequency module including the switch IC 10 which is an active element 9, filters 21, 22 and 23, a low-noise amplifier 31, a power amplifier 33, an inductor 6, and a capacitor 7. The switch IC 10, the low-noise amplifier 31, and the power amplifier 33 are active circuits. The inductor 6, the capacitor 7, and the filters 21, 22 and 23 are connected to the switch IC 10, and are passive circuits.

The inductor 6 and the capacitor 7 define and function as an impedance matching element.

The switch IC 10 switches propagation paths of a high-frequency signal inputted to the RF module 1. The switch IC 10, which is the active element 9, is provided in an IC substrate (not shown) or on an IC substrate. The switch IC 10 includes the switch 11 and the control circuit 12.

The switch 11 is preferably, for example, a semiconductor switch. The switch 11 includes a common terminal and a plurality of selection terminals, and switches connections between the common terminal and one of the plurality of selection terminals. The number of the plurality of selection terminals is arbitrary. As the plurality of selection terminals, for example, as illustrated in FIG. 2, four terminals are preferably provided, that is, respective terminals connected to the filters 21 to 23 to pass signals in different frequency bands, and a terminal through which a high-frequency signal is transmitted without a filter interposed therebetween. In this case, the switch 11 switches connections between the antenna element 2 and signal paths for four frequency bands each having different frequency bands. The common terminal of the switch 11 defines and functions as an input/output terminal of the RF module 1.

The control circuit 12 is preferably, for example, a digital control circuit that receives from the RFIC a control signal to control an operation of the switch 11, and controls driving of the switch 11. The received control signal includes a pulsed serial clock signal CLK and digital data (digital signals) DATA.

Further, the switch 11 receives voltages $V_{dd}$ and $V_{IO}$ via a control line from a power source (not shown) provided outside the RF module 1.

The filters 21, 22 and 23 have different pass bands, respectively. Each of the filters 21, 22 and 23 is preferably defined by, for example, a surface acoustic wave filter. Each of the filters 21, 22 and 23 is a reception filter which filters a received signal received by the antenna element 2 and passing through the switch 11 in each pass band, and outputs the filtered signal to a next stage circuit of the RF module 1. For example, the filter 21 is preferably a reception filter with a first frequency band being a pass band, and outputs a filtered signal to the switch 8 which is a next stage circuit of the RF module 1 with the low-noise amplifier 31 interposed therebetween. Further, the filter 22 is preferably a reception filter with a second frequency band being a pass band, and outputs a filtered signal to the switch 8 which is a next stage circuit of the RF module 1 with the low-noise amplifier 31 interposed therebetween. Additionally, the filter 22 not only defines and functions as the reception filter, but also defines and functions as a transmission filter which filters an output signal amplified by the power amplifier 33, and transmits the filtered signal from the antenna element 2 via the switch 11. Further, the filter 23 is preferably a transmission/reception filter with a third frequency band being a pass band.

The low-noise amplifier 31 defines and functions as an amplifier to amplify a high-frequency reception signal inputted to the RF module 1.

The power amplifier 33 defines and functions as an amplifier to amplify a high-frequency transmission signal outputted from the RF module 1.

Note that, each of the inductor 6, the capacitor 7, the filters 21, 22, and 23, the low-noise amplifier 31, and the power amplifier 33 corresponds to an electronic component.

With the above configuration, the RF module 1 controls the switch 11 by the control circuit 12 of the switch IC 10 which is the active element 9, to propagate a high-frequency signal received by the antenna element 2 to the RFIC 3 through an appropriate signal path. Similarly, the RF module 1 propagates a high-frequency signal through an appropriate signal path and transmits from the antenna element 2.

Note that, the RF module 1 may be a high-frequency module that defines and functions as only a reception/demultiplexing circuit, or a high-frequency module that defines and functions as only a transmission/multiplexing circuit. Further, the RF module 1 may be a demultiplexing/multiplexing circuit capable of both transmitting and receiving a signal as described above. Moreover, the number of frequency bands (signal paths) is not limited.

Further, the RF module 1 may not include the switch 8 as described above, or may include the switch 8. Additionally, the RF module 1 may include the filters 21, 22, and 23 as described above, or may not include the filters. Further, the RF module 1 may include the low-noise amplifier 31 and the power amplifier 33 as described above, or may not include the amplifiers.

A specific structure of the RF module 1 will be described in detail below.

The RFIC 3 performs signal processing on the high-frequency reception signal inputted from the antenna element 2 with the RF module 1 interposed therebetween, by down-converting, for example, and outputs a reception signal generated as a result of the signal processing to the BBIC 4.

The BBIC 4 performs signal processing using an intermediate frequency band of a lower frequency than a high-frequency signal at a front end unit. A signal processed in the BBIC 4 is used, for example, as an image signal for image display, or as a voice signal for communication via a speaker.

Figure 3:
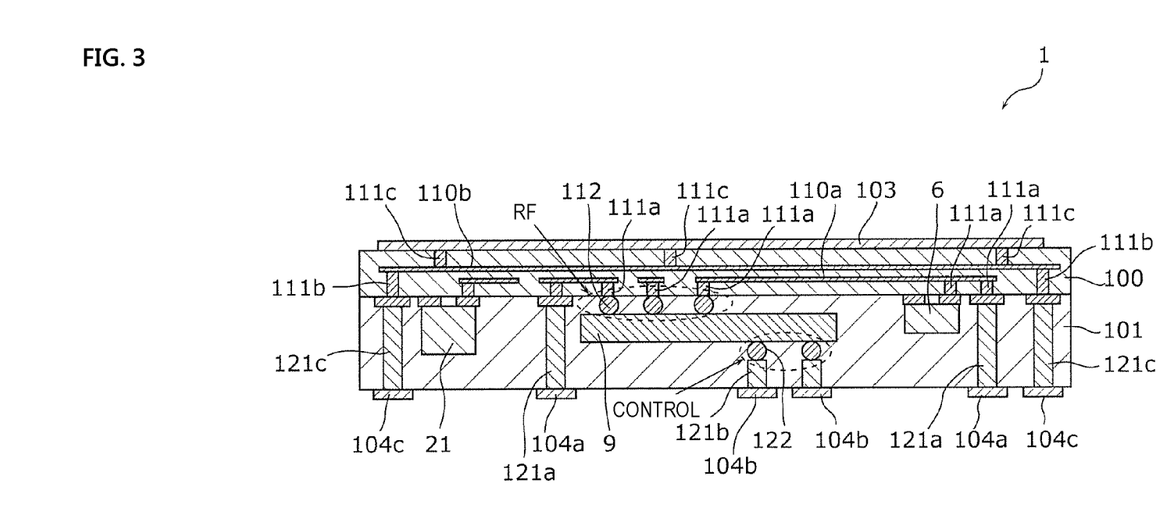
FIG. 3 is a sectional view illustrating the structure of a high-frequency module according to the Preferred Embodiment 1 of the present invention.
Figure 4:
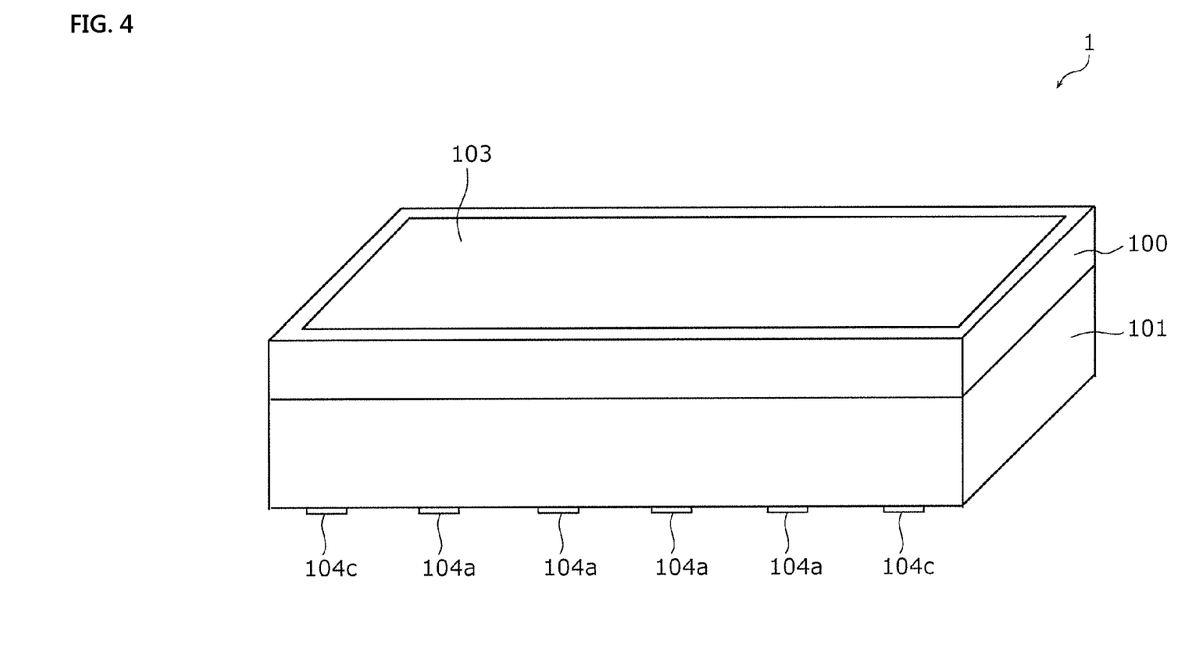
FIG. 4 is a perspective view illustrating the structure of the high-frequency module according to the Preferred Embodiment 1 of the present invention.
Figure 5:
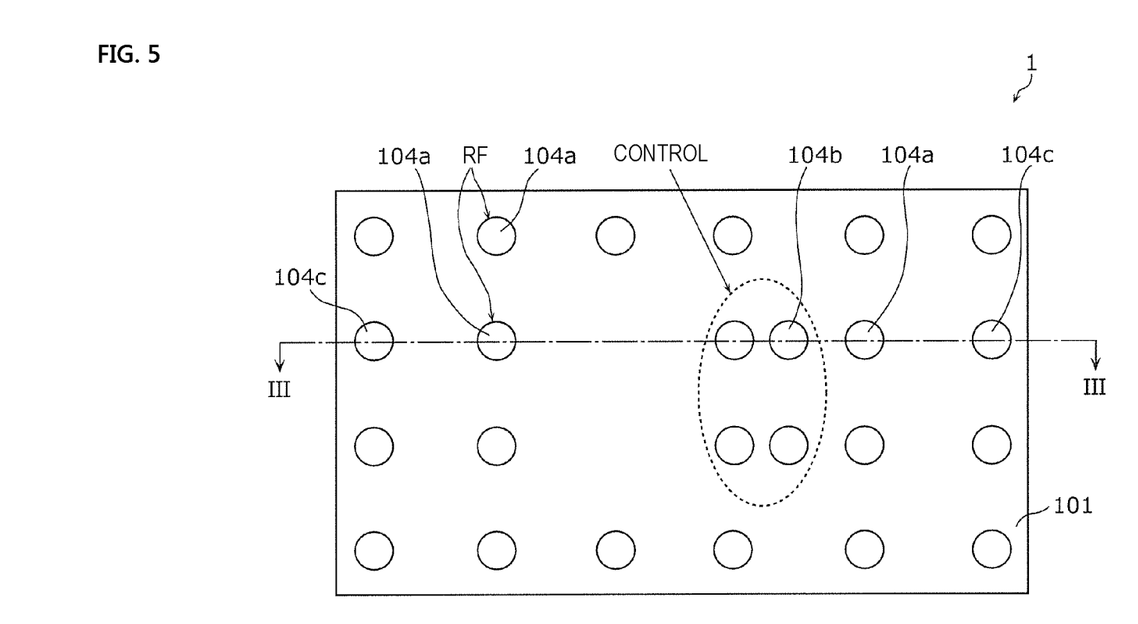
FIG. 5 is a plan view illustrating the structure of the high-frequency module according to the Preferred Embodiment 1 of the present invention.

Next, a structure of the RF module 1 will be described. FIG. 3 is a sectional view illustrating the structure of the RF module 1 according to the present preferred embodiment. FIG. 4 is a perspective view illustrating the structure of the RF module 1 according to the present preferred embodiment. FIG. 5 is a plan view illustrating the structure of the RF module 1 according to the present preferred embodiment.

As illustrated in FIG. 3, the RF module 1 includes a circuit board 100, the active element 9 (for example, the switch IC 10) mounted on the circuit board 100, a resin 101 sealing the active element 9, and a shield 103 disposed above a surface of the circuit board 100 opposite to a surface on which the active element 9 is mounted. Here, "above a surface" refers to a position on the surface and a position facing the surface. That is, "disposed above a surface of the circuit board 100 opposite to a surface on which the active element 9 is mounted" includes a case of being in direct contact with the surface of the circuit board 100 opposite to the surface on which the active element 9 is mounted, and a case facing, with another member interposed, the surface opposite to the surface on which the active element 9 is mounted. Further, outer electrodes 104a, 104b, and 104c are provided on the resin 101.

Note that, the active element 9 is not limited to the switch IC 10, and may be an LNA or a PA. Alternatively, the active element 9 may include a combination of at least two of the switch IC 10, the LNA, and the PA.

Wiring patterns 110a and 110b are provided in the circuit board 100. In FIG. 3, the wiring patterns 110a and 110b are provided in the circuit board 100. The wiring patterns 110a and 110b are provided by patterning a film of metal, such as copper, for example. The wiring pattern 110a is, for example, a wire through which a high-frequency signal is transmitted, and the wiring pattern 110b is a wire which is connected to the ground potential.

Further, a connection conductor 111a is disposed inside the circuit board 100 from the wiring pattern 110a toward a resin 101 side. Similarly, in the circuit board 100, a connection conductor 111b is disposed from the wiring pattern 110b toward the resin 101 side, and a connection conductor 111c is disposed from the wiring pattern 110b toward a shield 103 side. The connection conductors 111a, 111b, and 111c are preferably provided by filling holes, which are provided in the circuit board 100, with metal such as copper, for example. Note that, each of the connection conductors 111a, 111b and 111c may be a post having a predetermined shape that is provided in advance by metal, such as copper, for example.

In the circuit board 100, the active element 9, the inductor 6, the capacitor 7 (not shown), the filters 21, 22 (not shown), and 23 (not shown), the low-noise amplifier 31 (not shown), and the power amplifier 33 (not shown) are mounted on the connection conductors 111a.

The active element 9 is preferably, for example, the switch IC 10 described above. The active element 9 includes on one surface an RF wire through which a high-frequency signal is communicated. Further, the active element 9 includes a control wire through which a control signal is communicated, on another surface opposite to the one surface on which the RF wire is included. Note that, at least one RF wire is provided, and hereinafter, the at least one RF wire is collectively referred to as an RF line. In addition, at least one control wire is provided, and hereinafter, the at least one control wire is collectively referred to as a control line.

More specifically, as illustrated in FIG. 3, the active element 9 includes a first connection electrode 112 on a surface facing the circuit board 100, and a second connection electrode 122 on a surface opposite to the surface facing the circuit board 100. Note that, in the active element 9, the surface opposite to the surface facing the circuit board 100 is referred to as a top surface or another surface of the active element 9. The first connection electrode 112 is connected to an RF wire defining an RF line of the active element 9, and the second connection electrode 122 is connected to a control wire defining a control line of the active element 9. That is, the first connection electrode 112 is a portion of the wire defining the RF line of the active element 9, and the second connection electrode 112 is a portion of the wire defining the control line of the active element 9.

The active element 9 is mounted on the circuit board 100, for example, by connecting the first connection electrode 112 to the connection conductor 111a. That is, the active element 9 is connected to the wiring pattern 110a of the circuit board 100 with the first connection electrode 112 and the connection conductor 111a interposed therebetween.

Note that, although not illustrated, electronic components, such as the inductor 6, the capacitor 7 (not shown), the filters 21, 22 and 23 (not shown), the low-noise amplifier 31 (not shown), and the power amplifier 33 (not shown) may also be mounted on the circuit board 100 by being connected to the connection conductor 111a or 111b by connection electrodes.

The resin 101 is preferably a thermosetting resin, for example, and is disposed on the circuit board 100 so as to seal electronic components such as the active element 9, the inductor 6, and the filter 21 mounted on the circuit board 100.

Further, connection conductors 121a, 121b and 121c are provided in the resin 101. The connection conductors 121a and 121c penetrate the resin 101 from a surface of the resin 101 on a side at which the circuit board 100 is disposed to a surface of the resin 101 on a side at which the outer electrodes 104a, 104b and 104c are provided. Additionally, the connection conductor 121b is disposed at a position overlapping the active element 9 when viewed in plan view. Specifically, the connection conductor 121b extends from a surface of the resin 101 on a side at which the outer electrodes 104a, 104b and 104c are provided toward the connection electrode 122 disposed on the active element 9, and is connected to the connection electrode 122. The connection conductors 121a, 121b, and 121c are preferably provided by filling holes, which are provided in the resin 101, with metal, such as copper, for example. Note that, each of the connection conductors 121a, 121b and 121c may be a post provided in advance and made of metal, such as copper, for example, in a column shape.

The outer electrode 104a defines an RF line, the outer electrode 104b defines a control line, and the outer electrode 104c is connected to the ground potential. Each of the outer electrodes 104a, 104b and 104c is provided by patterning metal, such as copper, at a predetermined position and in a predetermined shape, for example. The outer electrodes 104a, 104b and 104c are connected to the connection conductors 121a, 121b and 121c, respectively. Note that, the outer electrode 104a and the connection conductor 121a, the outer electrode 104b and the connection conductor 121b, and the outer electrode 104c and the connection conductor 121c correspond to a first connection terminal, a second connection terminal, and a third connection terminal, respectively.

With the structure described above, in the RF module 1, the connection electrode 112, the connection conductor 111a, the wiring pattern 110a, the connection conductor 121a, and the outer electrode 104a define a wire defining an RF line. Further, the connection electrode 122, the connection conductor 121b, and the outer electrode 104b define a wire defining a control line. That is, the wire defining the RF line and the wire defining the control line extend to different surfaces of the active element 9, respectively. Further, the wire defining the control line is not connected to the wiring patterns 110a and 110b provided in the circuit board 100, but is connected to the outer electrode 104b provided on the resin 101 with the connection conductor 121b interposed therebetween. Thus, the wire defining the RF line and the wire defining the control line are not connected to the same circuit board 100. Thus, isolation between the RF line and the control line is able to be ensured.

As illustrated in FIG. 4, the shield 103 covers an entire or substantially an entire area on a surface of the circuit board 100 opposite to a surface on which the active element 9 is mounted. The shield 103 preferably has a film shape formed by sputtering metal, such as copper, for example. The shield 103 is connected to the wiring pattern 110b provided inside the circuit board 100, by the connection conductor 111c. Accordingly, since the shield 103 is connected to the ground potential with the wiring pattern 110b interposed therebetween, noise entering the RF module 1 from outside is able to be reduced or prevented.

Note that, as will be described later, the shield 103 may be provided, not only on the surface of the circuit board 100 opposite to the surface on which the active element 9 is mounted, but also on a side surface of the circuit board 100 and on a side surface of the resin 101.

Further, the outer electrodes 104a, 104b, and 104c may be disposed as illustrated in FIG. 5 when the RF module 1 is viewed from the resin 101 side. That is, the outer electrode 104b which is a portion of the wire defining the control line is disposed close to a center of the RF module 1, and the outer electrode 104a which is a portion of the wire defining the RF line surrounds a position at which the outer electrode 104b is disposed. Further, the outer electrode 104c connected to the ground potential is disposed on an outermost side of the RF module 1. Since the outer electrode 104c connected to the ground potential is disposed on the outermost side of the RF module 1, noise entering the RF module 1 from the outside is able to be reduced or prevented. Note that, in FIG. 5, a line III-III denoted by a dash-dotted line indicates a position of a sectional view of the RF module 1 illustrated in FIG. 3.

Note that, respective positions of the outer electrodes 104a, 104b, and 104c may be appropriately changed, for example, depending on a position of the active element 9.

As described above, according to the active element 9 of the present preferred embodiment, the wire (the RF wire) defining the RF line, and the wire (control wire) defining the control line do not extend to the same surface, but extend to different surfaces opposite to each other, in the active element 9. As a result, it is possible to reduce or prevent unnecessary coupling between the wires in the active element 9. Thus, the isolation between the RF line and the control line is able to be ensured, in the active element 9.

Additionally, in the RF module 1 according to the present preferred embodiment, the wire defining the RF line and the wire defining the control line extend to the different surfaces in the active element 9, respectively. Further, the wire defining the control line is not connected to the wiring patterns 110a and 110b provided in the circuit board 100, but is connected to the outer electrode 104b provided on the resin 101 with the connection conductor 121b interposed therebetween. As a result, the wire defining the RF line and the wire defining the control line are not connected to the same circuit board 100, and unnecessary coupling between the wires is able to be reduced or prevented inside the board, and therefore, the isolation between the RF line and the control line is able to be ensured in the RF module 1.

Preferred Embodiment 2

Figure 6:
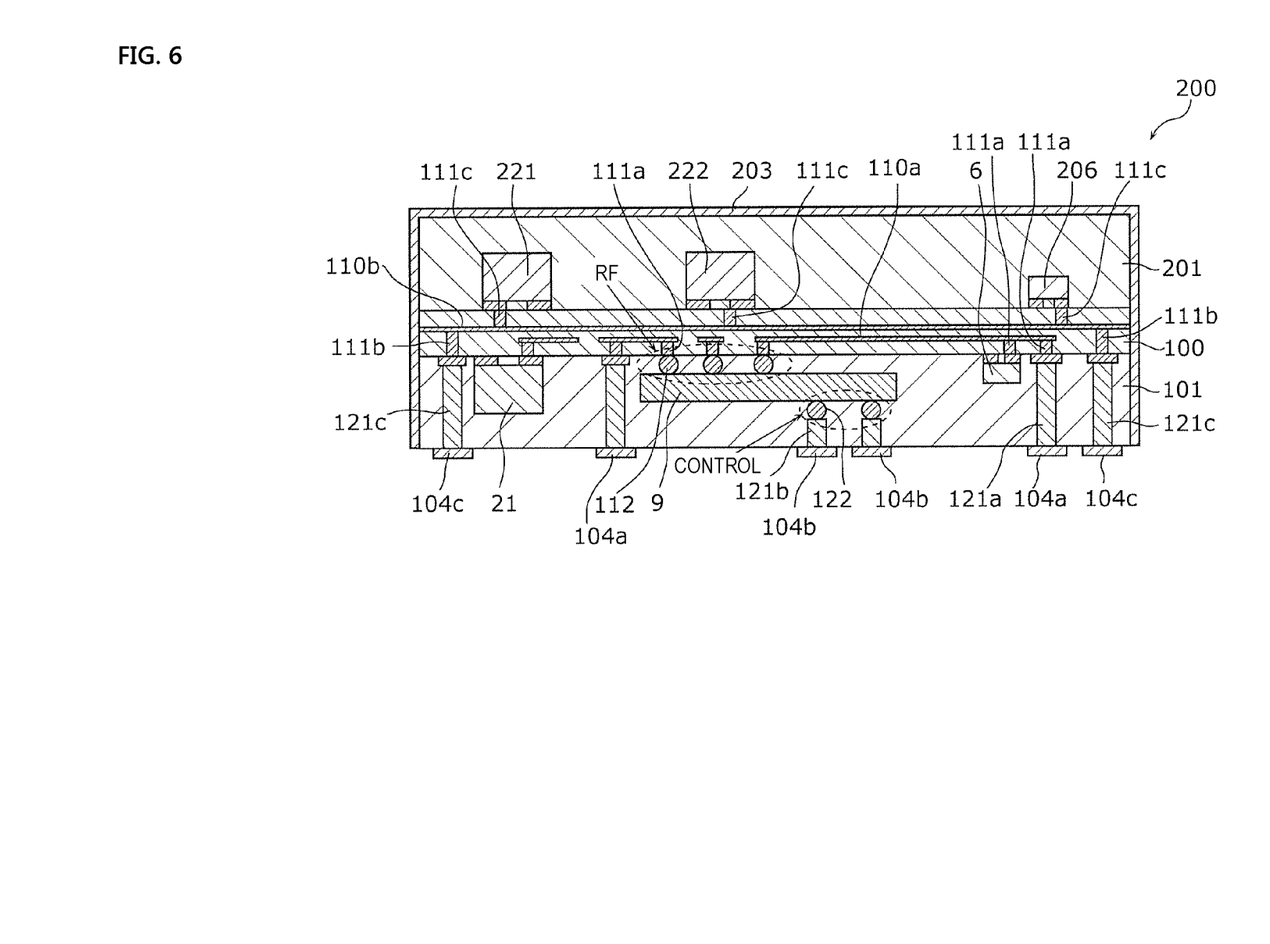
FIG. 6 is a sectional view illustrating the structure of a high-frequency module according to a Preferred Embodiment 2 of the present invention.

Next, an RF module 200 according to a Preferred Embodiment 2 of the present invention will be described. FIG. 6 is a sectional view illustrating a configuration of the RF module 200 according to the present preferred embodiment.

The RF module 200 according to the present preferred embodiment is different from the RF module 1 according to the Preferred Embodiment 1 in that electronic components are mounted on both sides of the circuit board 100, and sealed with a resin 201. Further, a shield 203 is provided on a top surface and side surfaces of the RF module 200. Here, the top surface of the RF module 200 refers to a surface opposite to a surface on which the outer electrodes 104a, 104b, and 104c are provided in the RF module 200. Further, the side surfaces refer to surfaces that connect the top surface and the surface of the RF module 200 on which the outer electrodes 104a, 104b, and 104c are provided.

As illustrated in FIG. 6, similar to the RF module 1 described in the Preferred Embodiment 1, the RF module 200 includes the active element 9, the inductor 6, the capacitor 7 (not shown), the filters 21, 22, and 23 (not shown), the low-noise amplifier 31 (not shown), and the power amplifier 33 (not shown) on a surface of the circuit board 100 on which the active element 9 is mounted. These electronic components are sealed on the circuit board 100 by the resin 101. Additionally, on the resin 101, the outer electrodes 104a, 104b, and 104c, and the connection conductors 121a, 121b, and 121c are provided. Since these configurations are the same or substantially the same as those of the RF module 1 described in the Preferred Embodiment 1, detailed description thereof will be omitted.

Further, as illustrated in FIG. 6, in the RF module 200, electronic components 206, 221, and 222 are mounted on a surface opposite to the surface on which the active element 9 is mounted. The electronic components 206, 221, and 222 are preferably, for example, an inductor, a capacitor, a filter, a low-noise amplifier, a power amplifier, and other suitable elements. The electronic components 206, 221, and 222 are preferably, for example, connected to the wiring pattern 110b with the connection conductor 111c interposed therebetween. Note that, the electronic components 206, 221, and 222 may be connected, not only to the wiring pattern 110b, but also to the wiring pattern 110a and other wires.

In this manner, since the electronic components are mounted on both sides of the circuit board 100, the number of the electronic components mounted on the circuit board 100 is able to be increased.

Furthermore, the resin 201 is disposed on a side of the circuit board 100 on a surface on which the electronic components 206, 221, and 222 are mounted, so as to seal the electronic components 206, 221, and 222. Similar to the resin 101 described in the Preferred Embodiment 1, the resin 201 is preferably made of, for example, a thermosetting resin. Note that, the resin 201 may be made of the same material as that of the resin 101, or may be made of a different material.

Further, the shield 203 is provided on the resin 201. Similar to the shield 103 described in the Preferred Embodiment 1, the shield 203 preferably has a film shape provided by sputtering metal, such as copper, for example. The shield 203 covers an entire or substantially an entire upper surface of the resin 201, and is also provided on side surfaces of the resin 201, side surfaces of the circuit board 100, and side surfaces of the resin 101. The shield 203 is connected to the wiring pattern 110b provided in the circuit board 100. Accordingly, since the shield 203 is connected to the ground potential with the wiring pattern 110b interposed therebetween, noise entering the RF module 200 from outside is able to be reduced or prevented.

With the configuration described above, in the RF module 200, the number of electronic components mounted on the circuit board 100 is able to be increased, and noise entering the RF module 200 from the outside is able to be reduced or prevented. In addition, similar to the RF module 1 described in the Preferred Embodiment 1, since a wire defining an RF line and a wire defining a control line are not connected to the same circuit board 100, isolation between the RF line and the control line is able to be ensured in the RF module 200.

Note that, the RF module 200 may be mounted on a communication device similar to the RF module 1 described in the Preferred Embodiment 1.

Preferred Embodiment 3

Next, an RF module 300 according to a Preferred Embodiment 3 of the present invention will be described.

Figure 7:
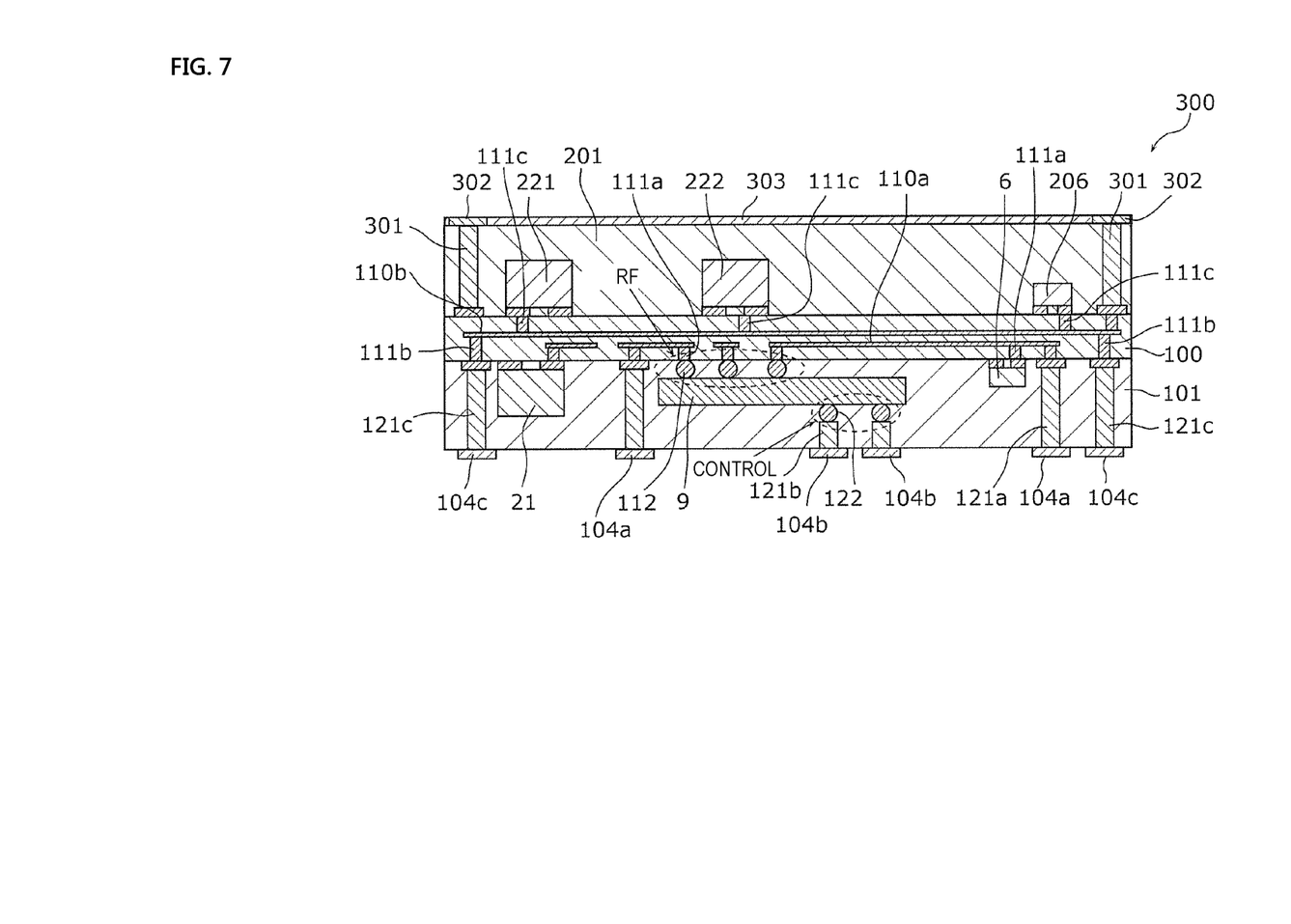
FIG. 7 is a sectional view illustrating the structure of a high-frequency module according to a Preferred Embodiment 3 of the present invention.

FIG. 7 is a sectional view illustrating a configuration of the RF module 300 according to the present preferred embodiment.

The RF module 300 according to the present preferred embodiment is different from the RF module 200 according to the Preferred Embodiment 2 in that connection conductors 301 are provided in place of the shield 203 provided on the side surfaces in the RF module 200.

As illustrated in FIG. 7, similar to the RF module 200 described in the Preferred Embodiment 2, the RF module 300 includes the active element 9, the inductor 6, the capacitor 7 (not shown), the filters 21, 22, and 23 (not shown), the low-noise amplifier 31 (not shown), and the power amplifier 33 (not shown), on a surface of the circuit board 100 on which the connection conductors 111a and 111b are exposed. These electronic components are sealed on the circuit board 100 by the resin 101. Additionally, the outer electrodes 104a, 104b, and 104c on the resin 101, and the connection conductors 121a, 121b, and 121c are provided. Furthermore, the electronic components 206, 221, and 222 are mounted on a surface of the RF module 300 opposite to a surface on which the active element 9 is mounted. These electronic components are sealed on the circuit board 100 by the resin 201. Since these configurations are the same or substantially the same as those of the RF module 1 described in the Preferred Embodiment 1, detailed description thereof will be omitted.

Further, a connection conductor 301 is provided in the resin 201. The connection conductor 301 penetrates the resin 201 from a surface on a side of the resin 201 on which the circuit board 100 is provided to a surface on a side on which an electrode 302 is provided. The connection conductor 301 penetrates the resin 201 from the circuit board 100 and is connected to a shield 303. The connection conductor 301 is connected to the ground potential within the circuit board 100. In FIG. 7, the connection conductor 301 is provided in a vicinity of a side surface of the resin 201. Here, the side surface of the resin 201 is a surface connecting a surface of the resin 201 on a side on which the circuit board 100 is provided and a surface on a side on which the shield 303 is provided, and the vicinity of the side surface of the resin 201 refers to a region between each side surface of the resin 201 and an electronic component closest to the each side surface of the resin 201, within the resin 201. For example, in FIG. 7, a region between the side surface of the resin 201 and the electronic component 206, and a region between the side surface of the resin 201 and the electronic component 221 are included. However, the connection conductor 301 need not be provided in the vicinity of the side surface of the resin 201, as long as the connection conductor 301 is connected to the ground potential and the shield 303.

Similar to the connection conductors 121a and 121c, the connection conductor 301 is preferably provided by filling a hole, which is provided in the resin 201, with metal, such as copper, for example. Note that, the connection conductor 301 may be a post provided in advance and made of metal, such as copper in a column shape. The connection conductor 301 is connected to the wiring pattern 110b with the connection conductor 111c provided in the circuit board 100 interposed therebetween.

Further, the electrode 302 is disposed at a position at which the connection conductor 301 is provided on a surface of the resin 201 opposite to a side on which the circuit board 100 is disposed. The electrode 302, similar to the outer electrodes 104a, 104b and 104c, is preferably provided by patterning metal, such as copper, at a predetermined position and in a predetermined shape, for example. The electrode 302 is connected to the connection conductor 301. That is, the electrode 302 is connected to the wiring pattern 110b with the connection conductor 301 interposed therebetween. As a result, the electrode 302 is connected to the ground potential with the wiring pattern 110b interposed therebetween.

Further, the shield 303 is provided on the resin 201. Similar to the shield 103 described in the Preferred Embodiment 1 and the shield 203 described in the Preferred Embodiment 2, the shield 303 preferably has a film shape provided by sputtering metal, such as copper, for example. The shield 303 is connected to the electrode 302. Thus, the shield 303 is connected to the wiring pattern 110b provided inside the circuit board 100 with the electrode 302, the connection conductor 301, and the connection conductor 111c interposed therebetween. As a result, the shield 303 is connected to the ground potential with the wiring pattern 110b interposed therebetween.

With the configuration described above, in the RF module 300, noise entering the RF module 300 from an outside is able to be reduced or prevented, even when a shield is not provided on the side surface of the resin 201 and a side surface of the circuit board 100.

Note that, the RF module 300 may be mounted on a communication device similarly to the RF module 1 described in the Preferred Embodiment 1.

Preferred Embodiment 4

Figure 8:
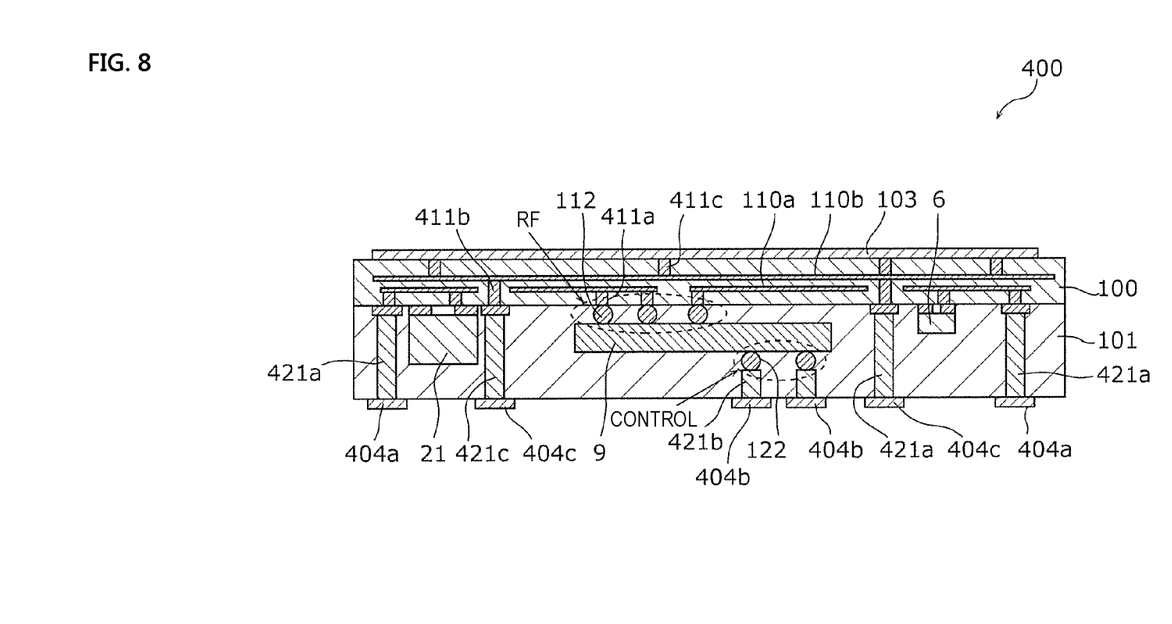
FIG. 8 is a sectional view illustrating the structure of a high-frequency module according to a Preferred Embodiment 4 of the present invention.
Figure 9:
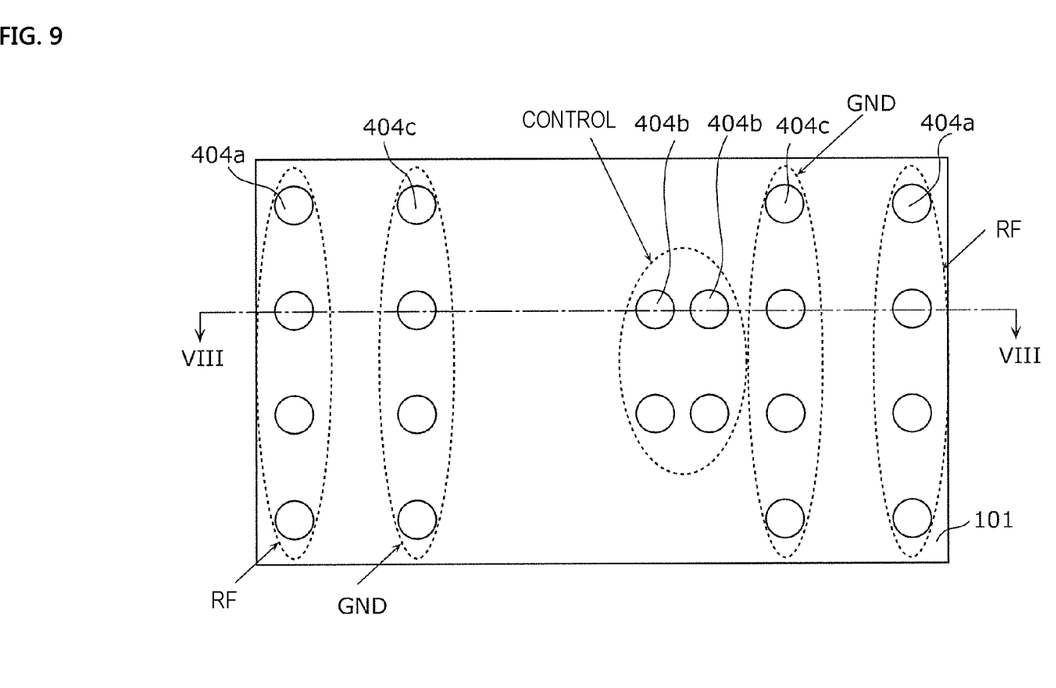
FIG. 9 is a plan view illustrating the structure of the high-frequency module according to the Preferred Embodiment 4 of the present invention.

Next, an RF module 400 according to a Preferred Embodiment 4 of the present invention will be described. FIG. 8 is a sectional view illustrating a configuration of the RF module 400 according to the present preferred embodiment. FIG. 9 is a plan view illustrating the disposition of terminals of the RF module 400 according to the present preferred embodiment.

The RF module 400 according to the present preferred embodiment is different from the RF module 1 according to the Preferred Embodiment 1 in that, in plan view of the RF module 400, electrodes connected to the ground potential are disposed between electrodes defining an RF line and electrodes defining a control line.

As illustrated in FIG. 8, similar to the RF module 1 described in the Preferred Embodiment 1, the RF module 400 includes the active element 9, the inductor 6, the capacitor 7 (not shown), the filters 21, 22, and 23 (not shown), the low-noise amplifier 31 (not shown), and the power amplifier 33 (not shown), on a surface of the circuit board 100 on which the connection conductors 111a and 111b are exposed. These electronic components are sealed on the circuit board 100 by the resin 101. Further, the shield 103 is disposed above a surface of the circuit board 100 opposite to a surface on which the active element 9 is mounted. Since these configurations are the same or substantially the same as those of the RF module 1 described in the Preferred Embodiment 1, detailed description thereof will be omitted.

Further, a connection conductor 411a extends inside the circuit board 100 from the wiring pattern 110a toward a resin 101 side. Similarly, in the circuit board 100, a connection conductor 411b extends from the wiring pattern 110b toward the resin 101 side, and a connection conductor 411c extends from the wiring pattern 110b toward a shield 103 side. Similar to the connection conductors 111a, 111b, and 111c described in the Preferred Embodiment 1, the connection conductors 411a, 411b, and 411c are preferably provided by filling holes, which are provided in the circuit board 100, with metal, such as copper, for example. The connection conductor 411a is connected to the connection electrode 112 or a connection conductor 421a which will be described below. The connection conductor 411b is connected to a connection conductor 421c which will be described below. The connection conductor 411c is connected to the shield 103.

Additionally, outer electrodes 404a, 404b, and 404c on the resin 101, and the connection conductors 421a and 421b, and a connection conductor 421c are provided. The outer electrodes 404a, 404b and 404c and the connection conductors 421a, 421b and 421c have the same or substantially the same configuration as that of the outer electrodes 104a, 104b and 104c, and the connection conductors 121a, 121b and 121c, described in the Preferred Embodiment 1, and thus, detailed description thereof will be omitted. The outer electrodes 404a, 404b, and 404c are connected to the connection conductors 421a, 421b, and 421c, respectively. That is, the outer electrode 404a is a portion of a wire defining an RF line, the outer electrode 404b is a portion of a wire defining a control line, and the outer electrode 404c is a portion of a wire connected to the ground potential.

Note that, the outer electrode 404a and the connection conductor 421a, the outer electrode 404b and the connection conductor 421b, and the outer electrode 404c and the connection conductor 421c correspond to a first connection terminal, a second connection terminal, and a third connection terminal, respectively.

Here, in the RF module 400, the outer electrode 404b which is a portion of the wire defining the control line is disposed close to a center of the RF module 400, and the outer electrode 404a which is a portion of the wire defining the RF line is disposed on an outermost side of the RF module 400. Further, the outer electrode 404c connected to the ground potential is disposed between the outer electrodes 404a and 404b.

That is, as illustrated in FIG. 9, in plan view of the RF module 400 from the resin 101 side on which the outer electrodes 404a, 404b, and 404c are provided, a region in which the outer electrode 404c which is a portion of the wire connected to the ground potential is disposed, is provided between a region in which the outer electrode 404a which is a portion of the wire defining the RF line is disposed and a region in which the outer electrode 404b which is a portion of the wire defining the control line is disposed. Note that, in FIG. 9, a line VIII-VIII denoted by a dash-dotted line indicates a position of a sectional view of the RF module 400 illustrated in FIG. 8.

Since the outer electrode 404c connected to the ground potential is disposed between the outer electrodes 404a and 404b, isolation between the wire defining the RF line and the wire defining the control line is able to be ensured. Thus, in the RF module 400, noise entering the RF module 400 from an outside is able to be reduced or prevented.

Note that, similarly to the RF module 1 described in the Preferred Embodiment 1, the RF module 400 may be mounted on a communication device.

Although the active elements, the high-frequency modules (RF modules), and the communication devices according to the preferred embodiments of the present invention have been described above, the active elements, the high-frequency modules, and the communication devices according to the present invention are not limited to the preferred embodiments described above. Other preferred embodiments which are provided by combining any of elements in the above-described preferred embodiments, modified examples which are obtained by making various modifications that those skilled in the art are able to conceive of to the above preferred embodiments without departing from the spirit of the present invention, and various devices including the high-frequency modules, and the communication devices described above are also included in the present invention.

For example, in the active elements, the high-frequency modules, and the communication devices according to the above-described preferred embodiments, another high-frequency circuit element, a wire, or other elements may be inserted in a path connecting respective circuit elements and signal paths disclosed in the drawings.

Further, electronic components may be mounted on one side of a circuit board, or may be mounted on both sides of a circuit board. When electronic components are mounted on one side of a circuit board, a shield may be provided on a surface of the circuit board on which an electronic component is not mounted. Additionally, in a case in which electronic components are mounted on both sides, a shield may be provided on a resin sealing the electronic components.

Moreover, a shield may be provided not only on a circuit board or a resin, but also on a side surface of the circuit board and on a side surface of the resin. Further, instead of the shield provided on the side surface of the resin, a connection conductor extending the resin may be provided in the resin in a vicinity of the side surface.

Also, a first connection terminal defining an RF line, a second connection terminal defining a control line, and a third connection terminal connected to the ground potential may be configured such that the third connection terminal is disposed between the first connection terminal and the second connection terminal, the first connection terminal may surround a periphery of the second connection terminal, or the third connection terminal may surround a periphery of the second connection terminal.

Further, an active element may be defined by a Complementary MOS (CMOS), for example. This makes it possible to manufacture the active element at a reduced cost.

Further, an active element may be made of GaAs, for example. Accordingly, a high quality digital control signal is able to be generated, and a high-frequency signal having high quality amplification performance and noise performance is able to be outputted.

Further, the active elements according to preferred embodiments of the present invention may be a Large Scale Integration (LSI) which is an integrated circuit. Further, a method for circuit integration may be implemented by a dedicated circuit or a general-purpose processor, for example. A Field Programmable Gate Array (FPGA) which is programmable after an LSI is manufactured, or a reconfigurable processor, for which connection and setting of circuit cells inside an LSI is able to be reconfigured, may be used. Further, when a circuit integration technology is developed to replace an LSI as a result of advancements in semiconductor technology, or another derivative technology, the technology may be used to integrate functions.

Preferred embodiments of the present invention are widely applicable to communication devices, such as a cellular phone, for example, as a high-frequency module disposed in a front-end unit supporting multiband/multimode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module, comprising:
a circuit board including a wiring pattern;
an active element, mounted on the circuit board, and including an RF wire disposed on a first surface of the active element and through which a high-frequency signal is communicated, a control wire disposed on a second surface of the active element opposite to the first surface and through which a control signal is communicated, a first connection electrode on one of the first and second surfaces of the active element facing the circuit board, and a second connection electrode on another one of the first and second surfaces of the active element opposite to the one of the first and second surfaces facing the circuit board;
a resin sealing the active element and a side of the circuit board on a surface of the circuit board at which the active element is mounted;
an outer electrode provided on a surface of the resin opposite to a surface of the resin at which the circuit board is disposed, and including a first outer connection terminal and a second outer connection terminal;
a first connection conductor penetrating the resin from the surface of the resin opposite to the surface at which the circuit board is disposed, and connecting the second connection electrode and the first outer connection terminal; and
a second connection conductor connecting the wiring pattern and the second outer connection terminal; wherein
a high-frequency signal is communicated through the first connection electrode;
a control signal is communicated through the second connection electrode;
the first connection electrode is connected to the wiring pattern; and
the second connection electrode is connected to the first connection conductor without the wiring pattern interposed therebetween.

2. The high-frequency module according to claim 1, wherein electronic components are mounted on both surfaces of the circuit board.

3. The high-frequency module according to claim 1, further comprising a shield disposed above a surface of the circuit board opposite to the surface on which the active element is mounted.

4. The high-frequency module according to claim 3, wherein the shield is provided on a side surface of the circuit board and on a side surface of the resin.

5. The high-frequency module according to claim 3, further comprising another connection conductor penetrating the resin from the circuit board and connected to the shield.

6. The high-frequency module according to claim 1, wherein
the second outer connection terminal penetrates the resin from a surface of the resin and is connected to the first connection electrode with the wiring pattern interposed therebetween; and
a third connection conductor is connected to a ground potential between the first connection conductor and the second connection conductor in plan view.

7. The high-frequency module according to claim 1, wherein the active element is a switch IC.

8. The high-frequency module according to claim 7, wherein the switch IC includes a switch and a control circuit.

9. The high-frequency module according to claim 8, wherein the switch is a semiconductor switch.

10. A communication device, comprising:
high-frequency module according to claim 1.

11. The communication device according to claim 10, wherein electronic components are mounted on both surfaces of the circuit board.

12. The communication device according to claim 10, further comprising a shield disposed above a surface of the circuit board opposite to the surface on which the active element is mounted.

13. The communication device according to claim 12, wherein the shield is provided on a side surface of the circuit board and on a side surface of the resin.

14. The communication device according to claim 12, further comprising another connection conductor penetrating the resin from the circuit board and connected to the shield.

15. The communication device according to claim 10, wherein
the second outer connection terminal penetrates the resin from a surface of the resin and is connected to the first connection electrode with the wiring pattern interposed therebetween; and
a third connection conductor is connected to a ground potential between the first connection conductor and the second connection conductor in plan view.

16. The communication device according to claim 10, wherein the active element is a switch IC.

17. The communication device according to claim 16, wherein the switch IC includes a switch and a control circuit.

18. The communication device according to claim 17, wherein the switch is a semiconductor switch.

19. The communication device according to claim 10, further comprising:
a radio frequency module;
a radio frequency signal processing circuit; and
a baseband signal processing circuit.

* * * * *